(12) United States Patent
Horch

(10) Patent No.: US 7,508,719 B2
(45) Date of Patent: Mar. 24, 2009

(54) NON-VOLATILE MEMORY CELL CIRCUIT WITH PROGRAMMING THROUGH BAND-TO-BAND TUNNELING AND IMPACT IONIZATION GATE CURRENT

(75) Inventor: Andrew E. Horch, Seattle, WA (US)

(73) Assignee: Virage Logic Corporation, Fremont, CA (US)

( * ) Notice: Subject to any disclaimer, the term of this patent is extended or adjusted under 35 U.S.C. 154(b) by 87 days.

(21) Appl. No.: 11/601,305

(22) Filed: Nov. 16, 2006

(65) Prior Publication Data

US 2008/0049519 A1    Feb. 28, 2008

Related U.S. Application Data

(60) Provisional application No. 60/839,771, filed on Aug. 24, 2006.

(51) Int. Cl.
*G11C 11/34* (2006.01)

(52) U.S. Cl. ............... 365/185.28; 365/185.29; 365/185.24

(58) Field of Classification Search ............ 365/185.28, 365/185.29, 185.24
See application file for complete search history.

(56) References Cited

U.S. PATENT DOCUMENTS

| | | | |
|---|---|---|---|
| 5,598,369 A | 1/1997 | Chen et al. | |
| 5,657,271 A | 8/1997 | Mori | |
| 6,143,607 A | 11/2000 | Chi | |
| 6,181,601 B1 | 1/2001 | Chi | |
| 6,442,074 B1 | 8/2002 | Hamilton et al. | |
| 6,510,086 B2 * | 1/2003 | Kato et al. | 365/185.29 |
| 6,781,881 B2 * | 8/2004 | Chih | 365/185.18 |
| 6,950,342 B2 | 9/2005 | Lindhorst et al. | |
| 2002/0027233 A1 | 3/2002 | Yamaki et al. | |
| 2002/0159298 A1 | 10/2002 | Hirano | |

OTHER PUBLICATIONS

Chen, I.C., et al., "A Quantitavie Physical Model For The Band-to-Band Tunneling-Induced Substrate Hot Electron Injection in MOS Devices", IEEE Transactions On Electron Devices, vol. 39, No. 7, Jul. 1992, pp. 1646-1651.

Figueroa, M., et al., "A Mixed-Signal Approach to High-Performance Low-Power Linear Filters", IEEE Journal of Solid-State Circuits, vol. 36, No. 5, May 2001, pp. 816-822.

(Continued)

*Primary Examiner*—Connie C Yoha
(74) *Attorney, Agent, or Firm*—Nixon Peabody LLP; David B. Ritchie

(57) ABSTRACT

Electronic circuitry is described having a first transistor having a first gate dielectric located between an electrically floating gate and a semiconductor substrate. The first injection current flows through the first gate dielectric to establish a first amount of electrical charge on the gate electrode. The electronic circuitry also includes a second transistor having a second gate dielectric located between the gate electrode and the semiconductor substrate. A band-to-band tunneling current flows between valence and conduction bands of the second transistor to create a second injection current that flows through the second gate dielectric to establish the first amount of electrical charge on the gate electrode. Non volatile memory cell circuits having the above described circuitry are also described.

36 Claims, 15 Drawing Sheets

OTHER PUBLICATIONS

Hyde, J., et al., "A Floating-Gate Trimmed, 14-Bit, 250 Ms/s Digital-to Analog Converter in Standard 0.25μm CMOS", Technical Paper, prior to Nov. 16, 2006, 4 pages.

Chang, C.Y. et al. "ULSI Devices" Library of Congress Cataloging-in-Publication Data:, Published 2000, pp. 119-124.

* cited by examiner

NON-VOLATILE MEMORY CELL CIRCUIT WITH PROGRAMMING THROUGH BAND-TO-BAND TUNNELING AND IMPACT IONIZATION GATE CURRENT

CLAIM OF PRIORITY

This patent application claims priority from U.S. Provisional Patent Application No. 60/839,771 filed on Aug. 24, 2006.

CROSS-REFERENCE TO RELATED APPLICATION

Cross-reference is made to the following related patent applications which are assigned to the same assignee as the present application:

U.S. patent application Ser. No. 11/601,474 filed on Nov. 16, 2006, titled "Non-Volatile Memory With Programming Through Band-To-Band Tunneling and Impact Ionization Gate Circuit" by Andrew E. Horch; and U.S. patent application Ser. No. 12/080,127 filed on Mar. 31, 2008, titled "Multi-Level Non-Volatile Memory Cell With High-VT Enhanced BTBT Device" by Andrew E Horch, et al.

BACKGROUND

1. Field of the Invention

The present description is related to the field of non volatile memory, and, more specifically, to a non volatile memory with programming through band-to-band tunneling and impact ionization gate current.

2. Description of the Related Art

FIG. 1 shows a prior art circuit design for a non-volatile memory cell. According to the prior art circuit observed in FIG. 1, the amount of charge residing on a floating gate 101 determines whether the cell is storing a logical "1" or a logical "0". The floating gate 101 is referred to as "floating" because it is not coupled to the typical output end of a transistor (e.g., a source or drain node).

In operation, in order to "program" the memory cell to a first logical state, after turning transistor Q3 "on" from SELECT line 104, high energy electrons are added to the floating gate 101 from transistor Q1. Here, the WELL/SOURCE voltage 102 is set to a voltage that causes a substantial $V_{SD}$ voltage drop from the source to the drain of the Q1 transistor. For instance, according to one approach, the voltage of the WELL/SOURCE node 102 is set to a large positive voltage 2VDD where VDD is a DC supply voltage creating a large voltage drop across transistor Q1. This large voltage drop corresponds to the establishment of a high intensity electric field running from the source of transistor Q1 to the drain of transistor Q1.

Transistor Q1 is also "on" in the sense that the charge level on floating gate 101 corresponds to a floating gate 101 voltage that is sufficiently below $V_S$-$V_T$ (where $V_S$ is the source voltage of transistor Q1=2VDD and $V_T$ is the threshold or "turn-on" voltage of transistor Q1). When transistor Q1 is sufficiently turned "on", a conductive channel is established within the substrate portion of transistor Q1 just beneath its gate dielectric.

In transporting the current within transistor Q1, holes within transistor Q1's conductive channel flow from Q1's source to drain and, in so doing, are accelerated to very high velocities by the high intensity electric field. These high energy holes collide with the semiconductor substrate lattice from which transistor Q1 is constructed. The collisions with the lattice create high energy electrons that have enough energy to surmount transistor Q1's gate dielectric energy barrier and travel to the floating gate 101 where they are collected. The collection of electrons on the floating gate 101 lowers the charge on the floating gate beneath some threshold which corresponds to a first logical state (e.g., a logical 1 or 0).

In order to "erase" the memory cell to a second logical state, electrons are removed from the floating gate 101 so as to effectively increase the charge on the floating gate 101 beyond a second threshold which corresponds to a second logical state. Here, electrons are tunneled by a Fowler-Nordheim tunneling mechanism from the floating gate 101 into the ERASE node 103 (i.e., the semiconductor substrate portion of transistor Q2). In the case of Fowler-Nordheim tunneling, a large positive voltage is placed on the ERASE node 103 so as to create a strong electric field that runs from the semiconductor substrate portion of transistor Q2 to the floating gate 101. This large positive voltage causes the energy band structure of the gate dielectric of transistor Q2 to resemble a sharp spike which promotes the tunneling of electrons through the energy barrier that resides between the floating gate 101 and the semiconductor substrate portion of transistor Q2.

Thus, the ability to accurately control the logical state being held by the memory cell corresponds to the ability to control the amount of high energy electrons that are injected onto the floating gate 101 from the substrate portion of transistor Q1 during a PROGRAM phase and the ability to accurately control the amount of electrons that tunnel from the floating gate 101 into the substrate portion of transistor Q2 during an ERASE phase. With the ever decreasing size of transistor dimensions (e.g., in terms of gate length and gate dielectric thickness), however, the ability to control these transport mechanisms is proving to be increasingly difficult.

For instance, according to one incorrect realm of operation, "too many" electrons are tunneled into the substrate portion of transistor Q2 during an ERASE phase resulting in the relative charge level of the floating gate 101 rising "too high" (e.g., at or too near $V_S$-$V_T$). In this case, transistor Q1 is not sufficiently "on" and, as a consequence, an insufficient amount of high energy electrons are created and injected onto the floating gate 101. The result is that the first logical state cannot be reached in time.

FIG. 2 depicts the problem graphically. FIG. 2 depicts the flow of high energy electrons onto the floating gate 101 during a PROGRAM phase (referred to as "impact ionization induced injection current") as a function of the charge that exists on the floating gate 101 (in terms of the difference between the charge level's corresponding floating gate voltage and the source node voltage of transistor Q1 ("normalized $|V_{GS}|$")). When the charge level is sufficiently low during the PROGRAM phase, the floating gate 101 voltage is sufficiently below $V_S$-$V_T$ which corresponds to region 201 of FIG. 2. The result is a sufficiently large, impact ionization induced injection current onto the floating gate that can reduce the floating gate 101 voltage to the first logical state during the PROGRAM phase.

However, if the charge level on the floating gate rises because too many electrons are tunneled off the floating gate 101 during an ERASE phase, the region of operation for a following PROGRAM phase is to the right of region 201 where a roll-off 202 in the curve is observed. This roll-off 202 corresponds to a drop in the impact ionization induced current that is injected to the floating gate during a PROGRAM phase that results from little or no $I_{DS}$ current flowing through transistor Q1 because of the large floating gate voltage (said another way, transistor Q1 is not sufficiently "on" under such conditions). Thus, if the charge level on the floating gate rises too high from the ERASE phase, region 202 will be reached which corresponds to an impact ionization induced injection current magnitude that is too small to drop the floating gate charge level to the first logical state during the PROGRAM phase.

BRIEF SUMMARY

The present description gives instances of electronic circuitry having a first transistor having a first gate dielectric located between an electrically floating gate and a semiconductor substrate. The first injection current flows through the first gate dielectric to establish a first amount of electrical charge on the gate electrode. The electronic circuitry also includes a second transistor having a second gate dielectric located between the gate electrode and the semiconductor substrate. A band-to-band tunneling current flows between valence and conduction bands of the second transistor to create a second injection current that flows through the second gate dielectric to establish the first amount of electrical charge on the gate electrode.

BRIEF DESCRIPTION OF THE DRAWINGS

These and other features and advantages of this description will become more readily apparent from the following Detailed Description, which proceeds with reference to the drawings, in which.

DETAILED DESCRIPTION

Figure 1:
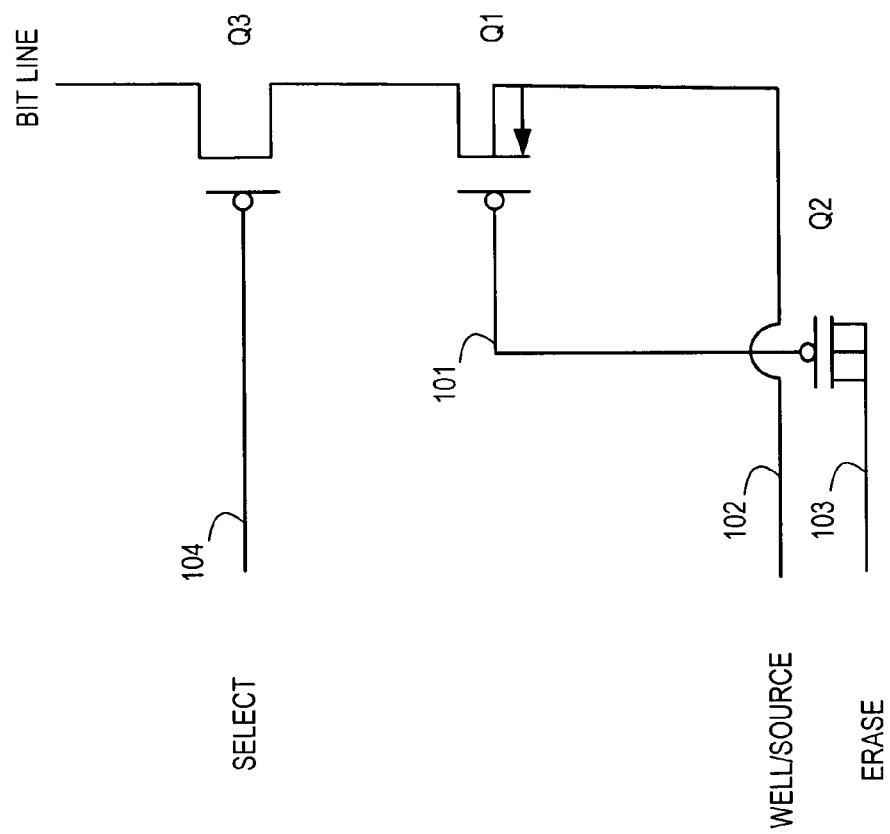
FIG. 1 shows a prior art non volatile memory circuit.
Figure 2:
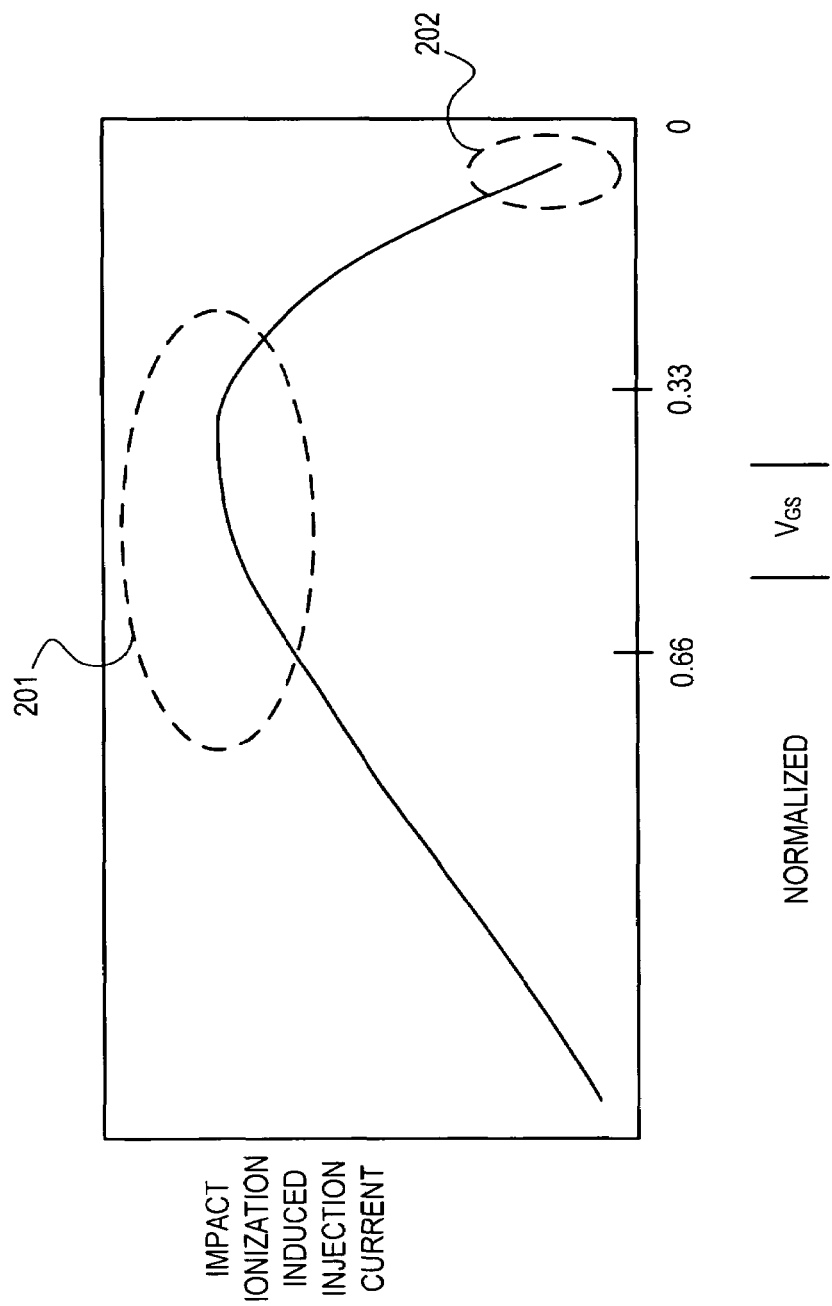
FIG. 2 shows a graph of a transistor's gate current resulting from impact ionization within the transistor's conductive channel.
Figure 3A:
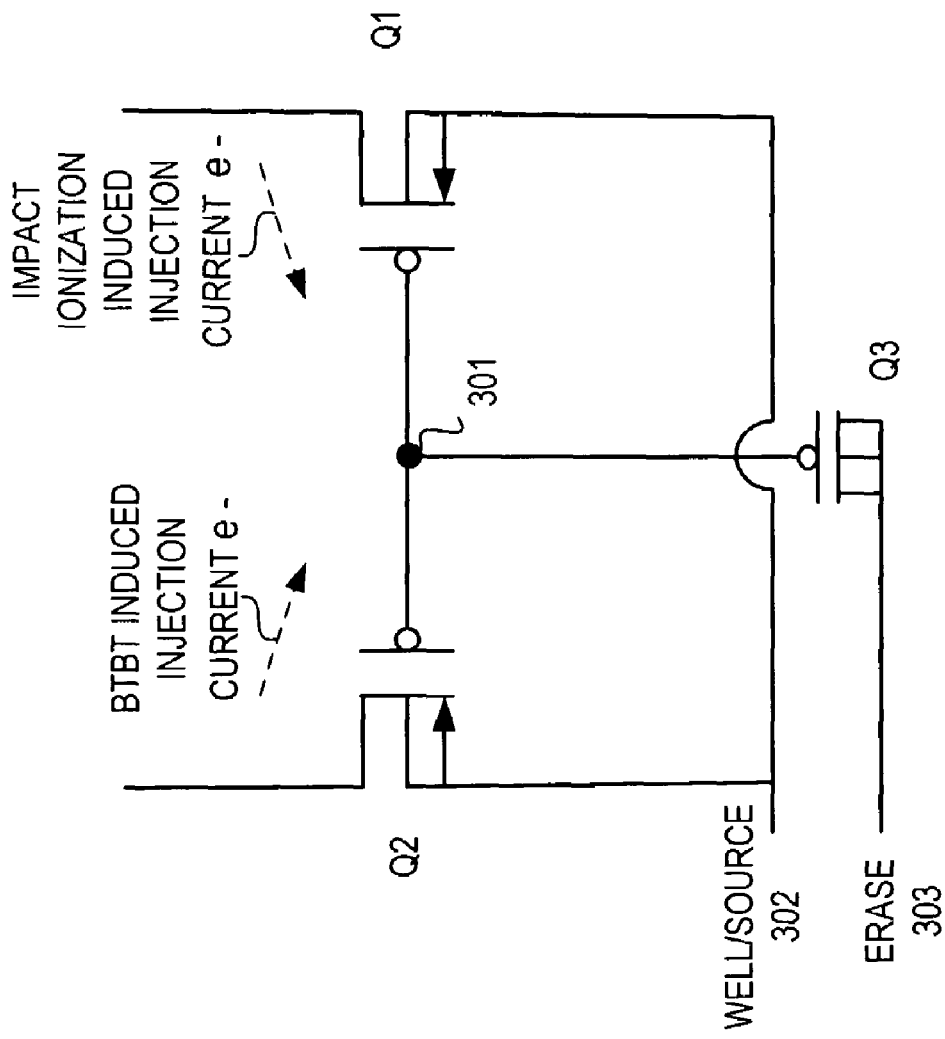
FIG. 3A shows an improved floating gate design capable of using both impact ionization current and band-to-band tunneling current to cause the floating gate to reach an amount of charge.
Figure 3B:
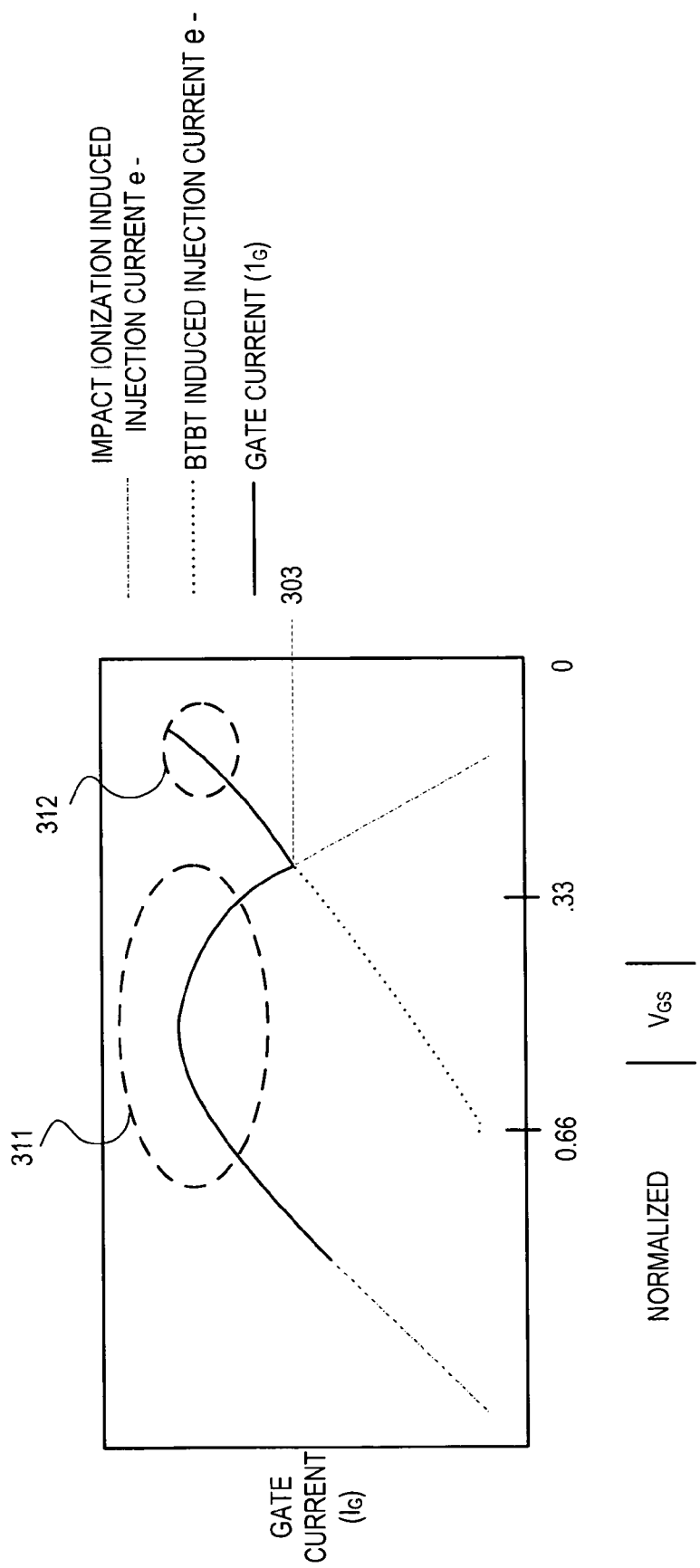
FIG. 3B shows one embodiment of a graph of the gate electrode current for the circuit of FIG. 3A that demonstrates the contribution to the gate electrode current from both an impact ionization current component and a band-to-band tunneling current components.

FIG. 3A shows a circuit diagram for an improved non volatile memory cell that avoids the problems described above with respect to the prior art circuit of FIG. 1. FIG. 3B graphically depicts a possible design point for the circuit of FIG. 3A that is directly comparable to FIG. 2.

Referring to FIG. 3A, transistor Q1 and the Fowler-Nordheim tunneling transistor Q3 (noting that reference Q2 was used for the tunneling transistor with reference to FIG. 1) operate as described above with respect to FIG. 1. That is, during a PROGRAM phase, high energy electrons (created from lattice collisions with carriers accelerated in Q1's conductive channel) are supposed to be injected to the floating gate 301 from the substrate portion of transistor Q1 thereby lowering the floating gate 301 charge level and corresponding voltage to a first logical state. Moreover, during an ERASE phase, electrons are removed from the floating gate 301 by Fowler-Nordheim tunneling through the gate dielectric of transistor Q3 so as to raise the charge level and corresponding voltage on the floating gate 301 to a second logical state.

If too many electrons are removed from the floating gate 301 during the ERASE phase so as to raise the floating gate's charge and corresponding voltage to too high a level to permit transistor Q1 to adequately supply high energy electrons to the floating gate 301 during a subsequent PROGRAM phase, the floating gate's charge and voltage will nevertheless be properly lowered during the subsequent PROGRAM phase because transistor Q2 will supply electrons to the floating gate 301 even though it may be subject to the same gate, source and drain node conditions as transistor Q1. Note that transistor Q2, similar to transistor Q1, uses the floating gate 301 at its own gate node thereby preserving the floating gate node's status as "floating" because it is not driven by a node of a transistor that is typically used as an output.

Here, transistor Q2 is specifically designed to be "different" than transistor Q1 so that it will inject current into the floating gate 201 by way of a different physical mechanism than transistor Q1. As a consequence, transistor Q2 is capable of injecting electrons onto the floating gate 201 even though transistor Q1 is not (e.g., in the case where a previous ERASE phase raised the voltage on the floating gate too high to sufficiently turn on transistor Q1).

FIG. 3B demonstrates the approach. Essentially, FIG. 3B shows that the total floating gate node current (represented as a solid line) is the summation of gate injection currents contributed by transistor Q1 (represented as a "dash-dot" line) and transistor Q2 (represented as a dotted line). Here, because transistor Q2 injects electrons onto the floating gate 301 by way of a different physical mechanism than transistor Q1, its gate current curve is fundamentally different than the gate current curve of transistor Q1. This effectively corresponds to FIG. 3B depicting the addition of a new and different curve relative to the curve originally discussed with respect to FIG. 2.

The curve for transistor Q2 shows increasing gate current, rather than a roll-off, moving to the right along the horizontal axis. Thus, according to the approach depicted in FIG. 3B, transistor Q2 effectively compensates for transistor Q1 in that it increasingly contributes electrons to the floating gate as the region of operation moves to the right beyond region 311 where the curve for transistor Q1 is observed to roll off. Better said, according to the approach of FIG. 3B, when transistor Q1 can no longer supply sufficient numbers of electrons to the floating gate (because the floating gate voltage is too high), transistor Q2 "steps in" and provides such electrons instead.

Level 303 of FIG. 3B simply corresponds to a preferred level of total electron flow into the floating gate needed to properly lower the voltage of the floating gate node to the first logical state. Note that the solid curve representing the contribution of both transistors Q1 and Q2 is always at or above this level 303 for all operating regions of the memory cell. Here, note in particular the dramatic increase in electron flow at high floating gate node voltages for the circuit of FIG. 3A as compared to the circuit of FIG. 1 as seen by comparing region 312 of FIG. 3B with region 212 of FIG. 2.

With an understanding that sufficient electron flow into the floating gate over a wider span of operating regions can be achieved through the introduction of a transistor Q2 to the floating gate node that injects electrons to the floating gate by way of a different physical mechanism than transistor Q1, some discussion of the physical mechanism is appropriate.

Referring to FIG. 3A note that transistor Q2 is tied to the WELL/SOURCE node 302 in the same manner as transistor Q1. Also recall from the discussion of FIG. 1 that during the PROGRAM phase the WELL/SOURCE node 302 is set to a substantially high positive voltage (e.g., 2VDD) in order to establish a very strong electric field that runs from the source node of transistor Q1 to the drain node of transistor Q1. According to the operation of the circuit of FIG. 3A, the substantial positive voltage applied at the WELL/SOURCE node 302 during a PROGRAM phase results in a high intensity electric field that runs from the floating gate node 301 and terminates in the semiconductor substrate of transistor Q2 (at least for very high floating gate voltages).

In alternate implementations in order to increase the strength of this electric field, the well (and source) nodes of transistor Q2 may be set to a voltage that is less than 2VDD (e.g., to ground or any voltage between ground and 2VDD). In this case, the well and source nodes of transistors Q1 and Q2 are respectively driven to different voltages (e.g., 2VDD for the source and well nodes for transistor Q1 and ground for the well and source nodes of transistor Q2) and therefore require different DC drive circuits to drive them to their respective voltages. Also, like transistor Q1, transistor Q2 may be technically "off" because the voltage of the floating gate node 301 is too large with respect to the source so as to prevent the formation of a conductive channel from the source node.

Figure 4:
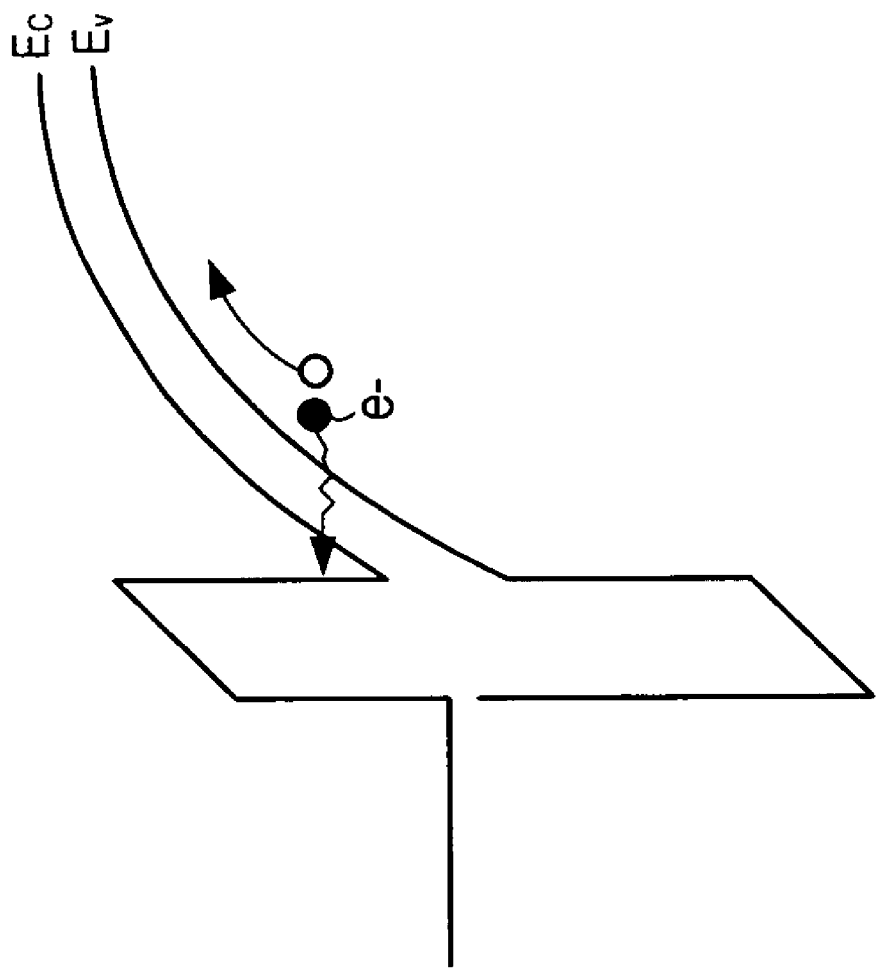
FIG. 4 shows energy band diagrams for the respective transistors Q1 and Q2 of FIG. 3A.

Referring now to FIG. 4, which shows the energy band diagram of transistor Q2, the high intensity electric field results in severe energy band bending in the N-Well of transistor Q2 that results in "band-to-band" tunneling in the diode of drain and N-Well. According to the band-to-band tunneling mechanism, because of the influence of the high intensity electric field, electrons in the valence band tunnel into the conduction band and the holes left behind travel to the drain. The electrons are accelerated by the lateral electric field toward the channel region and may gain enough energy to travel across the $SiO_2$ barrier to the floating gate.

The high intensity electric field results in severe energy band bending in the semiconductor substrate of transistor Q2 that results in "band-to-band" tunneling in the semiconductor substrate of transistor Q2. According to this band-to-band tunneling mechanism, because of the influence of the high intensity electric field, electrons in the valence band tunnel toward the floating gate and into the conduction band. The tunneling electrons create holes in the valence band which, also under the influence of the high intensity electric field, accelerate rapidly away from the gate dielectric of transistor Q2 and deeper into the semiconductor substrate. These high energy holes collide with the semiconductor lattice and create high energy electrons that have sufficient energy to cross over the energy barrier between the semiconductor substrate and the floating gate node and therefore flow into the floating gate node where they are collected. Thus, in this manner, transistor Q2 injects high energy electrons onto the floating gate.

According to a further design strategy, transistor Q2 is purposely designed to have a higher intensity electric field beneath and near the edges of its gate than transistor Q1 owing to the presence, for example, of more acceptor dopant atoms at least near the drain regions of transistor Q2 as compared to transistor Q1. The presence of more acceptor atoms in the drain regions of transistor Q2 results in the flux lines of the high intensity electric field flux in transistor Q2 being terminated closer to the surface of the substrate beneath the gate dielectric in transistor Q2 than in the drain regions of transistor Q1 (which essentially means the gate-drain electric field is stronger in transistor Q2 than in transistor Q1).

The result is more severe energy band bending in the drain regions of transistor Q2 toward the gate than in transistor Q1; which, in turn, corresponds to the presence of substantial band-to-band tunneling within the drain regions of transistor Q2 but not within transistor Q1. Again, note that like transistor Q1, transistor Q2 may still be "off" in the sense that no conductive channel is created in the source of transistor Q2 because the voltage on the floating gate 301 is too high with respect to the voltage of the source of transistor Q2. The carriers produced by band-to-band tunneling that are collected by the drain are sometimes called GIDL (Gate Induced Drain Leakage).

Figure 5:
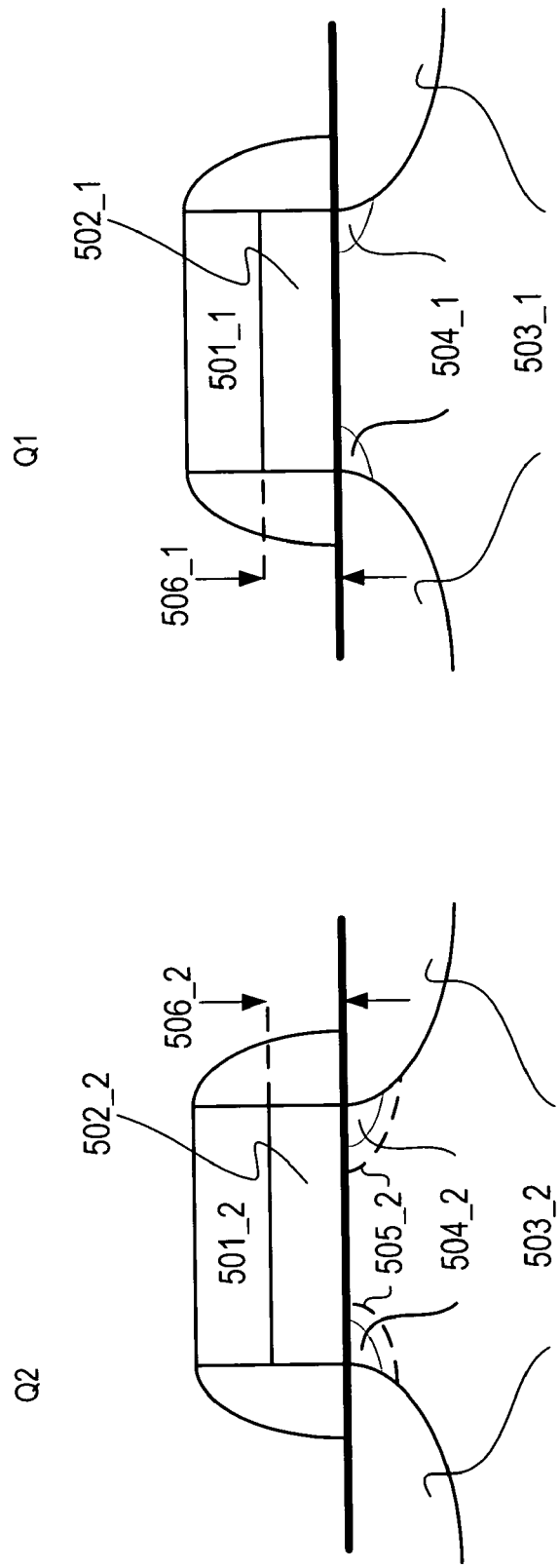
FIG. 5 shows doping profiles for transistors Q1 and Q2 of FIG. 3A.

FIG. 5 depicts an example of how transistor Q2 may be made to have more dopant atoms than transistor Q1. Here, transistor Q2 has more features in its dopant profile than transistor Q1 as depicted by the presence of source/drain extensions 504_2 and halos 505_2 in transistor Q2 but not in transistor Q1. According to one embodiment, the non volatile memory cell is constructed with "I/O" transistors, which are different than the core logic transistors of the semiconductor die in which the non volatile memory cell is constructed. Here, the I/O transistors have a thicker gate dielectric than the core logic transistors because the I/O transistors are expected to handle larger voltages associated with driving/receiving signals off/on the semiconductor die.

The non volatile memory cell is constructed from these same I/O transistors because of the large voltages used at the WELL/SOURCE 302 and TUNNEL 303 nodes to induce the respective high energy electron injection and Fowler-Nordheim tunneling mechanisms. According to known prior art manufacturing processes, however, elaborate dopant profiles such as source/drain extensions, lightly doped drains and halos are not performed in the manufacture of I/O transistors, but rather, are used only in the manufacture of core logic transistors.

As is known in the art, halo implants have been used to prevent "punch-through" through the gate dielectric thereby permitting shorter channel regions in the core logic transistors and source/drain extensions have been used to reduce resistance in the substrate region below the gate spacer. Due to the lower operating voltages of the core logic transistors, these devices can tolerate a more highly doped channel and source/drain extension. Both source/drain (S/D) extension and lightly doped drain (LDD) implants are below the spacer. LDD is called LDD because the dopant concentration is significantly lower that of the S/D, while a S/D extension is approximately the same (e.g., LDD dopant concentration ~1e19 atoms/$cm^3$; S/D extension dopant concentration=source drain region dopant concentration ~1e20 atoms/$cm^3$).

Thus, one approach is to construct transistor Q2, which may be an I/O transistor in perhaps all other respects, except that it has one or more of the complex doping features traditionally implemented only into core logic transistors (such as source/drain extensions, lightly doped drains and halos). Alternatively or in combination, the density of dopant acceptor atoms (e.g., in the source/drain regions) may simply be made higher in transistor Q2 than in transistor Q1 (e.g., with just a higher core logic transistor threshold voltage implant).

Figure 6:
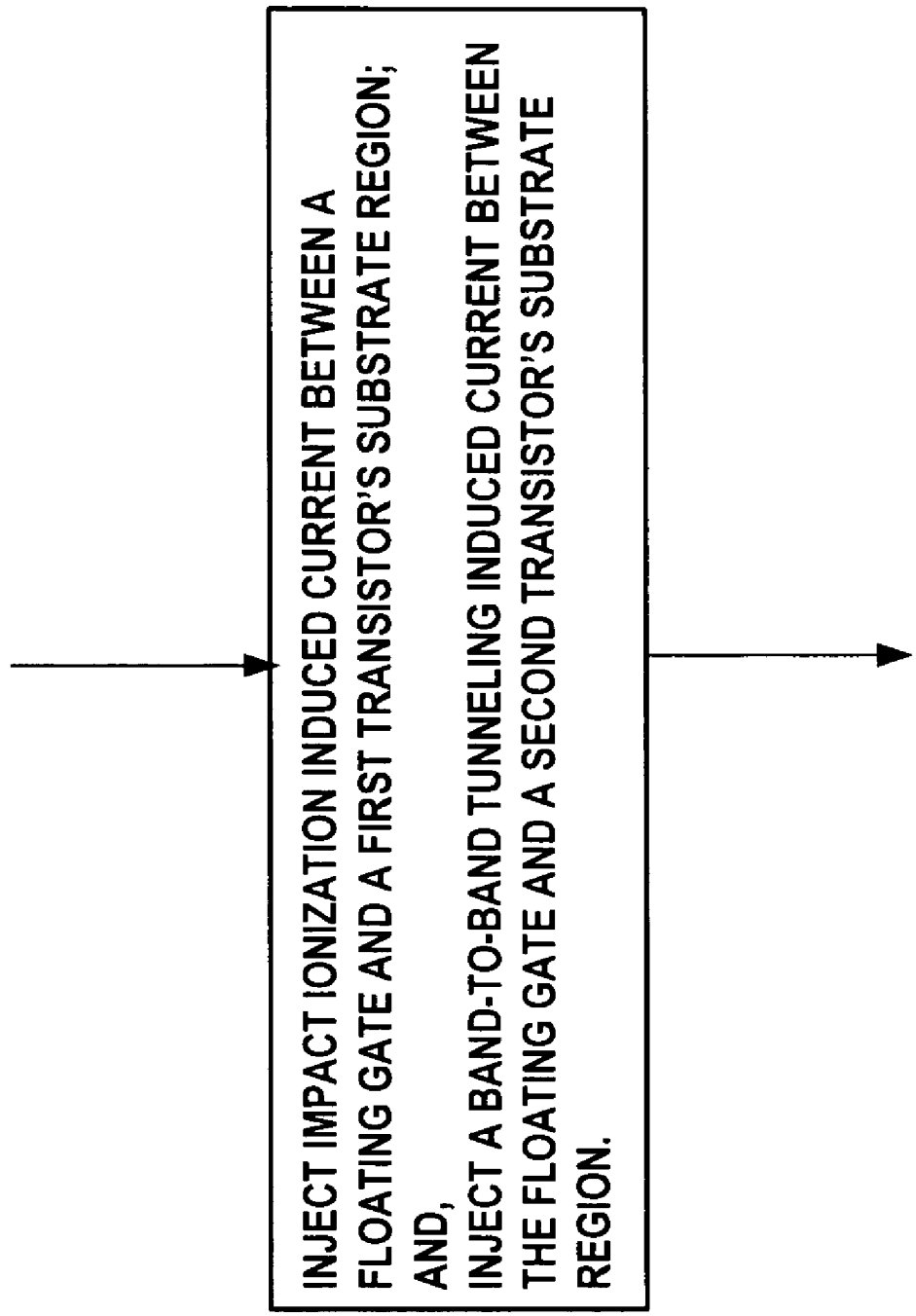
FIG. 6 depicts a method of operation of the circuit of FIG. 3A.
Figure 7:
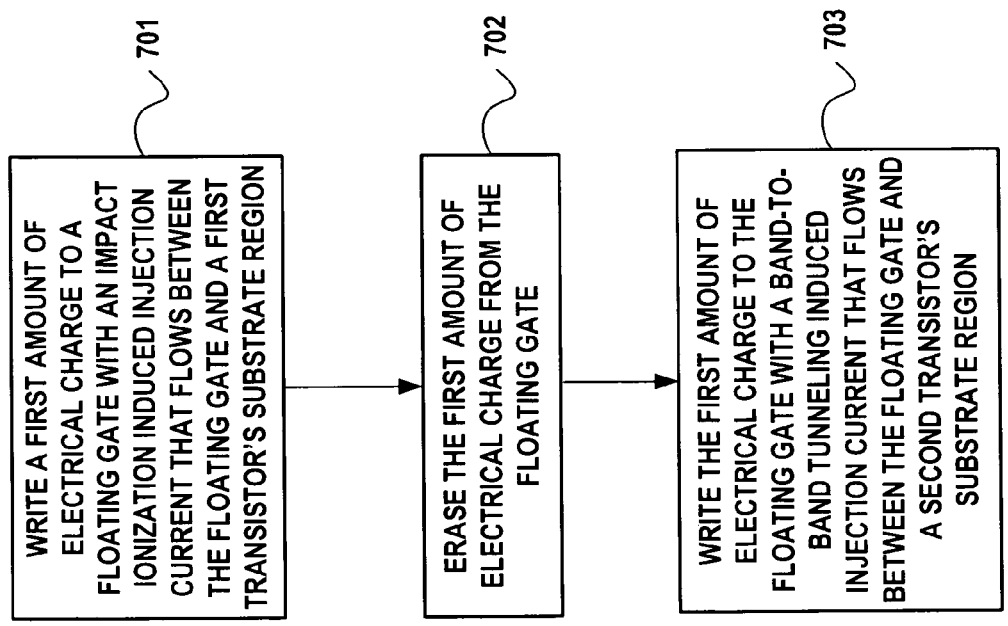
FIG. 7 depicts another method of operation of the circuit of FIG. 3A.

FIGS. 6 and 7 illustrate methodologies of operation consistent with the discussion provided above. First, according to the methodology of FIG. 6, electrical charge may be written to a floating gate by injecting both a first injection current between a floating gate and a first transistor's semiconductor substrate region and a second injection current between the floating gate a second transistor's semiconductor substrate where the carriers of the second injection current are created by carriers created from a band-to-band tunneling current within the second transistor's semiconductor substrate 601. Note that the methodology of FIG. 6 covers those situations where both types of injection currents are simultaneously acting together to add electrons to the floating gate during a same PROGRAM phase (e.g., the inflection point in FIG. 3 at level 303 where the two curves from the two different injection mechanisms overlap) as well as covers those situations where one type of injection current is used during one PROGRAM phase and the other type of injection current is used during another PROGRAM phase.

FIG. 7 elaborates on an example of the later where injection during a first PROGRAM phase results from the injection of high energy electrons that were given enough energy to cross the gate dielectric energy barrier of a first transistor from collisions between the first transistor's substrate lattice and carriers accelerated in the first transistor's conductive channel (e.g., as discussed at length above with respect to transistor Q1) 701. Then, during a subsequent ERASE phase too many electrons are removed from the floating gate resulting in a floating gate node voltage that is too high for the type of injection that occurred during the first write phase to occur 702. Thus, during a second PROGRAM phase that follows the ERASE phase, high energy electrons are injected onto the floating gate that were given enough energy to surmount the gate dielectric energy barrier of a second transistor by high energy carriers created by a band-to-band tunneling current within the second transistor 703.

Figure 8A:
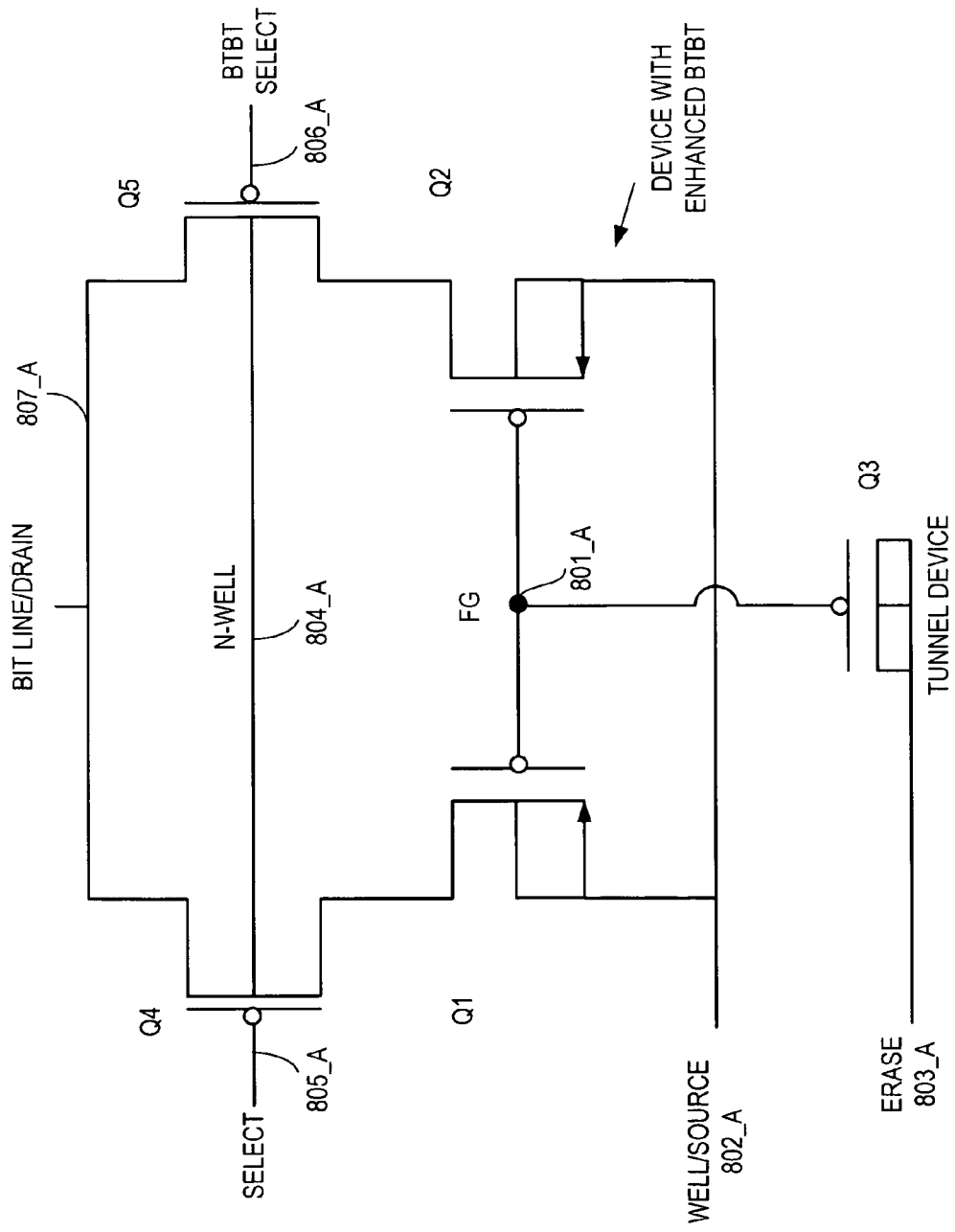
FIG. 8A depicts a first non volatile memory cell circuit utilizing the design of FIG. 3A.
Figure 8B:
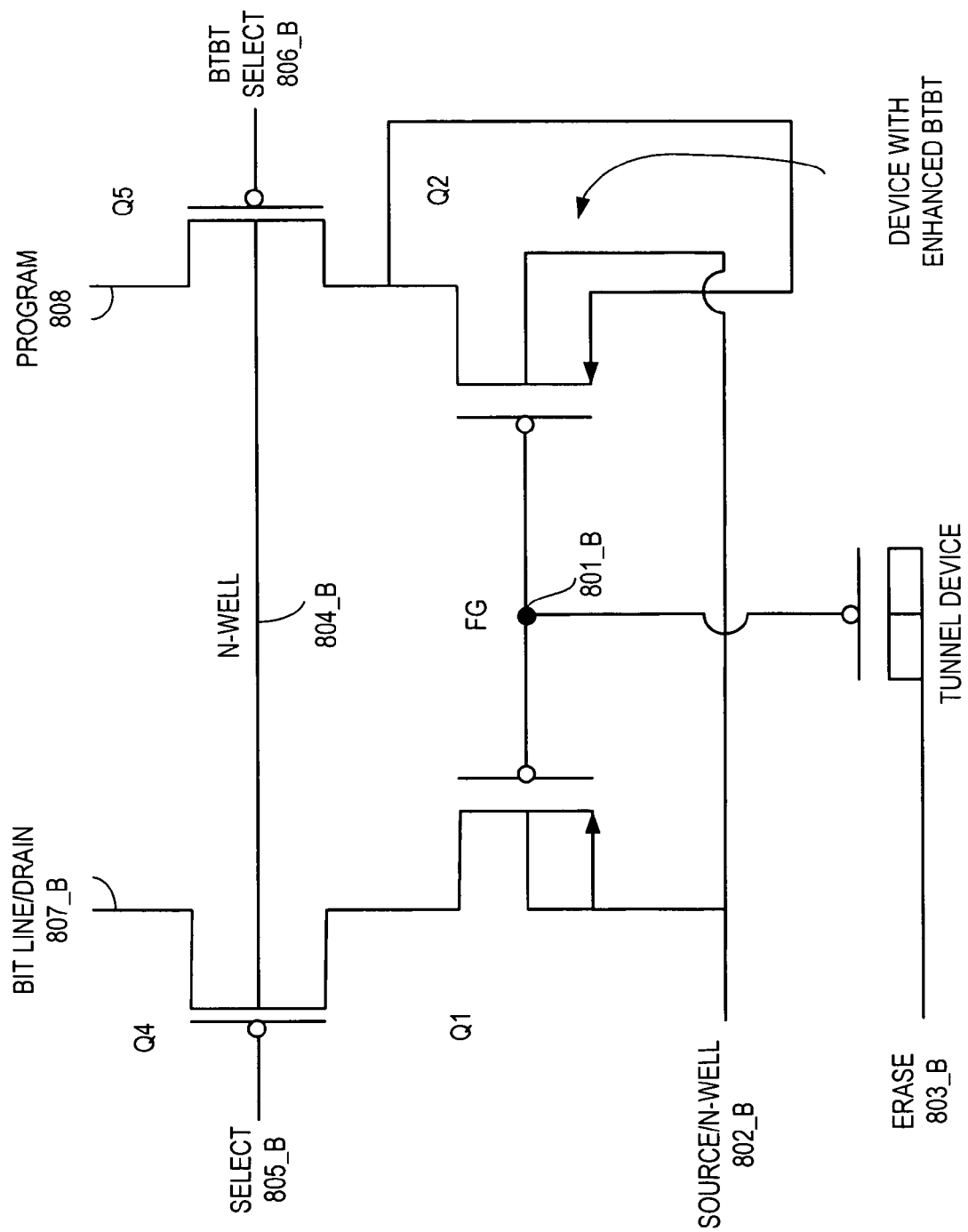
FIG. 8B depicts a second non volatile memory cell circuit utilizing the design of FIG. 3A.
Figure 8C:
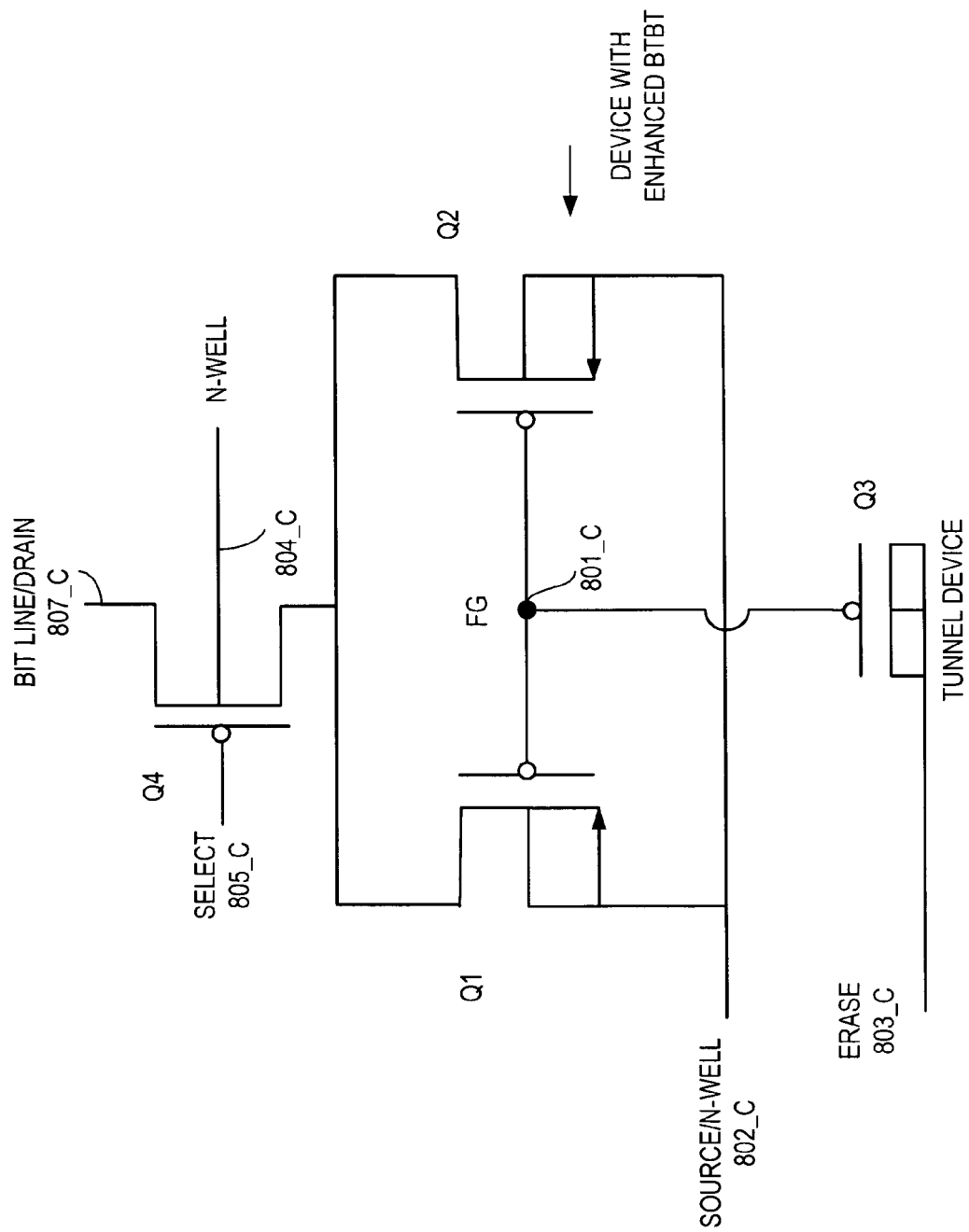
FIG. 8C depicts a third non volatile memory cell circuit utilizing the design of FIG. 3A.

FIGS. 8A through 8C show different implementations of memory cell circuits that employ p type transistors as observed in FIG. 3A. In the memory cell designs of FIGS. 8A through 8C, transistors Q1, Q2 and Q3 operate as described above. Also, in each of FIGS. 8A through 8C, the ERASE node 803 is driven be circuitry that creates a large positive voltage to attract electrons through Fowler-Nordheim tunneling through the gate dielectric of transistor Q3. This circuitry may include a charge pump circuit to raise the voltage higher the supply voltage(s) supplied to the semiconductor chip; or, more simply, the semiconductor chip may receive the large voltage from off-chip source and the circuitry simply routes this large voltage to the ERASE node (e.g., through a switch having a control input coupled to a logic circuit output to control that controls the switch's state).

The WELL/SOURCE node 802_A is driven by circuitry that also creates a large positive voltage (e.g., by any of the types of circuits described just above) to: 1) create a large ISD current in transistor Q1; and, 2) create a strong gate-to-drain electric field that causes band-to-band tunneling within the substrate of transistor Q2. As discussed above with respect to FIG. 3A, the WELL/SOURCE nodes of transistors Q1 and Q2 may in fact be driven to different voltage levels (e.g., where the well and source of Q2 is driven to a lower voltage (e.g., ground) than the well and source of transistor Q1) by different driving circuits during the same PROGRAM phase in order to ensure the presence of a high intensity electric field running from the floating gate to the Q2 substrate needed to induce band-to-band tunneling within transistor Q2.

With respect to FIG. 8A, according to one embodiment, during the PROGRAM phase, the WELUSOURCE node 802 is set to a large positive voltage (e.g., 2VDD), the ERASE node 803_A is set to ground (so as to diminish the attraction of electrons to the substrate of the tunnel transistor Q3), the SELECT lines 805_A, 806_A are set to ground to turn on their respective transistors Q4, Q5 and permit any current flowing from Q1, Q2 to flow into the BIT LINE 807_A. Both of the SELECT lines 805_A, 806_A (as well as the other SELECT lines in the following figures) are driven in part by addressing logic circuitry that identifies this particular cell is to be programmed. The BIT LINE 807_A is set to ground to provide an electric potential "sink" for any current flowing from transistors Q1 and Q2.

During the ERASE phase, the ERASE node 803_A is set to a large positive voltage to induce Fowler-Nordheim tunneling of electrons into the substrate region of transistor Q3. The WELUSOURCE node 802_A is set to a low voltage (or low voltage for transistor Q1 and high voltage for transistor Q2) to ensure that these transistors do not add electrons to the floating gate during the ERASE phase.

During a READ phase, the WELL/SOURCE node 802_A is set to a positive voltage (e.g., VDD) between the floating node voltage associated with the first and second logical states, SELECT line 805_A is low to turn on Q4 but select line 806_A is high to turn Q5 off. If the floating gate 801_A is in the first logical state (low), transistors Q1 and Q2 are "on" but current can only flow from transistor Q1 (and not from transistor Q2) into the drain node 807_A because transistor Q5 is off. Here, turning Q5 off to prevent any current flow from transistor Q2 effectively prevents overloading of any standard prior art sense amplifier circuitry that is coupled to the BIT LINE 807_A to sense the current flowing from the BIT LINE 807_A. If the floating gate 801_A is in the second logical state (high), transistors Q1 and Q2 are "off" and no current flows from the BIT LINE 807_A.

The circuit of FIG. 8B operates similarly to that of the circuit of FIG. 8A except that the band-to-band-tunneling device Q2 is geared to be incapable of transporting any currents other than the band-to-band-tunneling induced current injected to the floating gate node because its drain and source nodes are configured to be at the same electrical potential. Because the Q2 device can not provide or sink any source-to-drain or drain-to-source current its only activity is to inject band-to-band tunneling induced current (i.e., it cannot inject the type of gate current injected by transistor Q1). It therefore has a separate PROGRAM line 808 that, in one embodiment, is set to the same potential as the bit line/drain node 807_B during the PROGRAM phase and is set to the same potential as the source node 802_B during a READ phase. Here, the PROGRAM line 808 may be driven by switch circuitry having a first input coupled to the output of the logic circuitry driving node 807_B, a second input coupled to an output of the high voltage circuitry that drives node 802_B and a control input driven by logic circuitry that indicates whether the cell is in the PROGRAM phase or the READ phase. SELECT line 806_B is set to ground to turn on Q5 only during the PROGRAM phase as well.

During the READ phase the program node 808 is held at the same potential as the source/n-well node 802_B and the BTBT select node 806_B is held low (to turn Q5 "on") to keep the drain, source and well voltages of transistor Q2 about the same thereby preventing the Q2 device from injecting any band-to-band tunnelling current onto the floating gate 801_B and disturbing the read operation. During an unselected PROGRAM (i.e., a different floating gate that shares the same PROGRAM line 808 is being programmed) the BTBT select node 806_B is held high to turn device Q5 off and shield device Q2 from having a high electric field between it's well and drain. As such, the BTBT select node 806_B may be driven by logic circuitry that indicates whether the memory cell is selected and in READ mode or in some other state.

FIG. 8C operates similarly to that of the circuit of FIG. 8A except that the BIT LINE 807_C is capable of receiving current that flows from Q2 during a READ phase because of the single SELECT line 805_C and corresponding transistor Q4.

Figure 9:
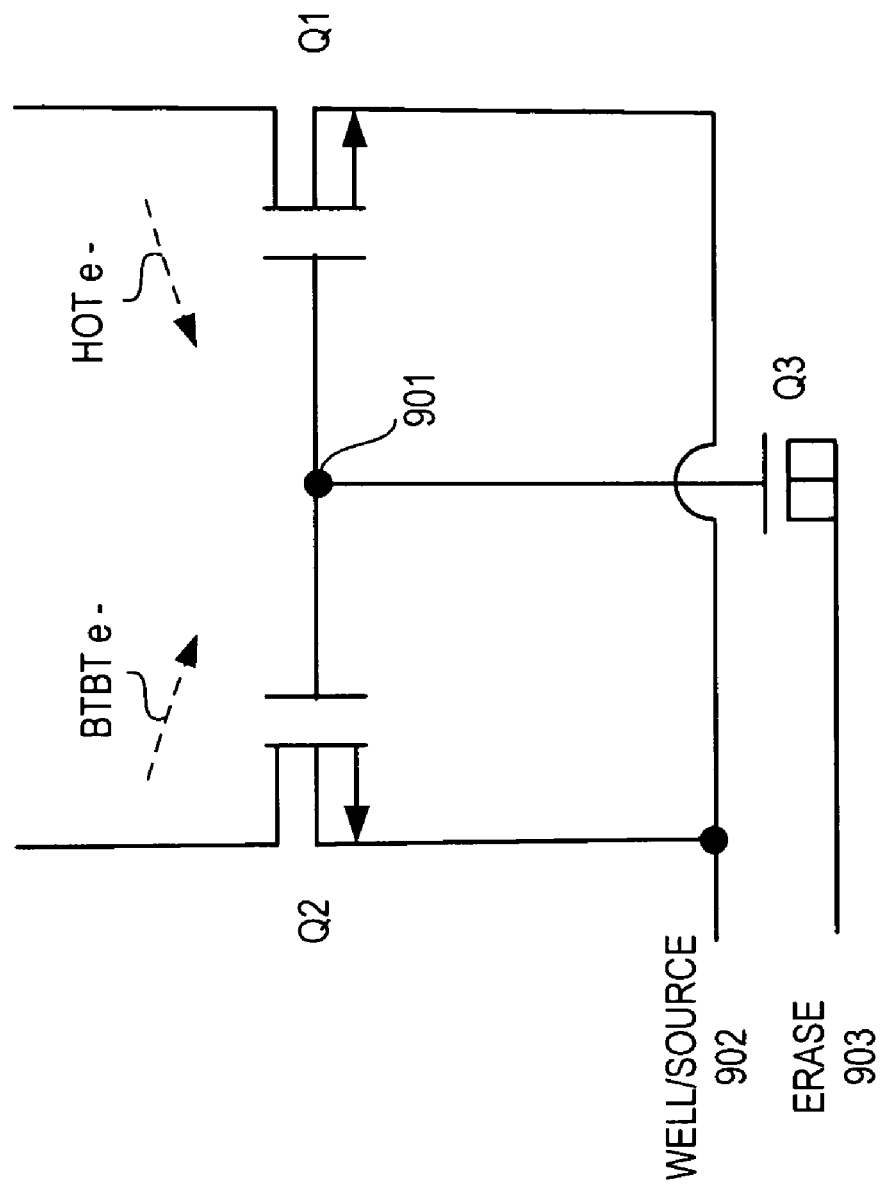
FIG. 9 depicts the circuit of FIG. 3A implemented with n type transistors.

FIG. 9 demonstrates that, rather than using p-type devices (as illustrated in FIG. 3A), n-type devices may be used. In the case of an n-type approach, the sources of Q1 and Q2 are tied to a p type well node (rather than an n type WELL node). During a PROGRAM phase, a low voltage (e.g, ground) is applied to the WELL/SOURCE node 902. If the floating gate voltage is large (e.g., because the tunneling device Q3 removed too many electrons from the floating gate), transistor Q1 will be "on" and will therefore inject high energy electrons created by collisions between Q1's substrate lattice and carriers that were accelerated in Q1's conductive channel. Likewise, if the floating gate voltage is significantly low (e.g., because the Q3 device did not tunnel enough electrons) so as to fail to turn transistor Q1 on, transistor Q2 will inject electrons to the floating gate node 901 that were induced by band-to-band tunnelling with Q2. Here, Q2 may have its channel region doped with acceptor atoms (e.g., like a p type core logic transistor) so as to create a device that will exhibit a strong electric field running from the floating gate into the substrate so as to induce band-to-band tunneling.

Figure 10:
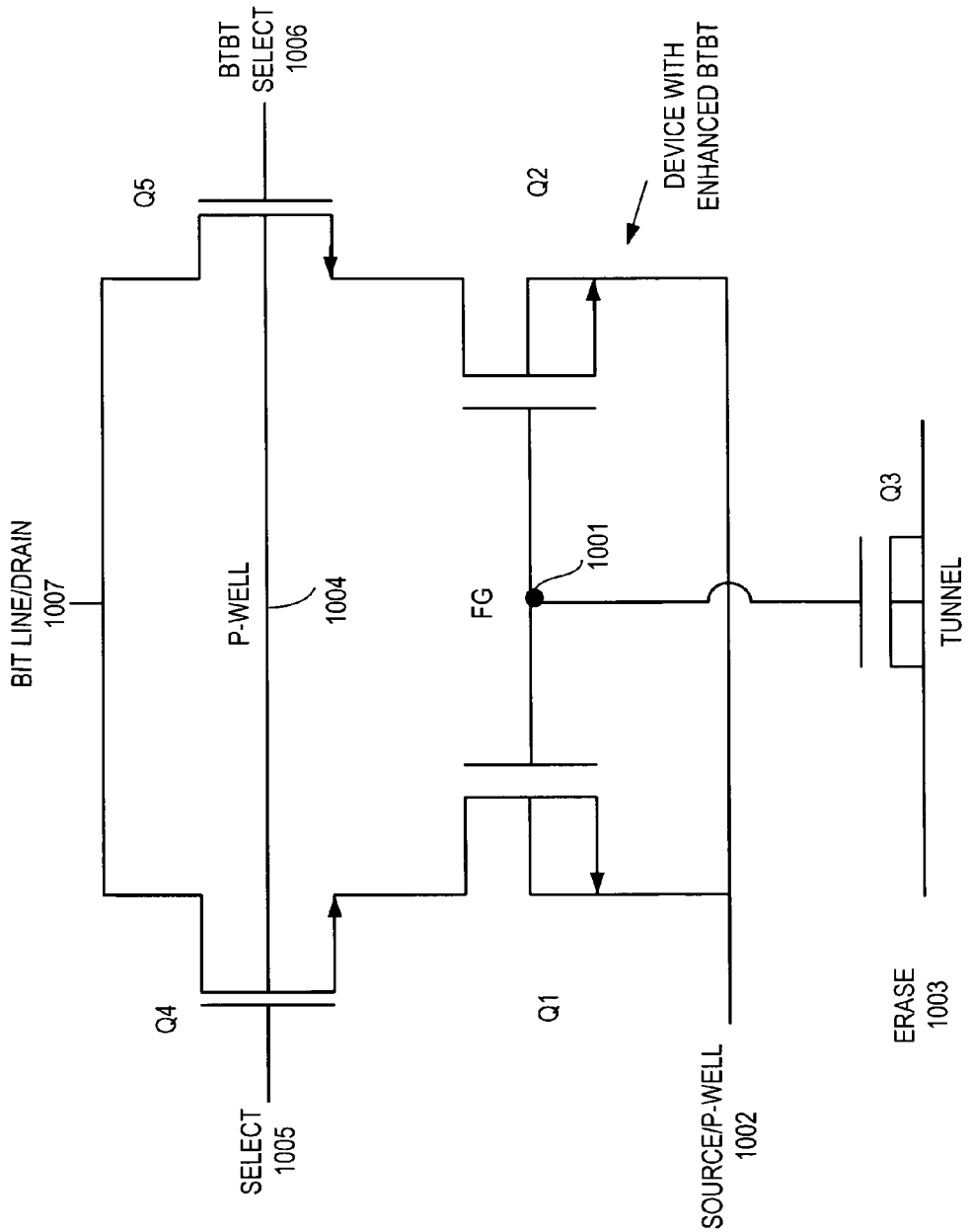
FIG. 10 depicts a non volatile memory cell circuit utilizing the design of FIG. 9.

FIG. 10 shows a memory cell constructed with n type Q1 and Q2 transistors that operates as described just above with respect to FIG. 9. The circuit operates similar to the circuit of FIG. 8A in the sense that during a PROGRAM phase, transistors Q4 and Q5 are on and the WELL node is supplied with a substantial low voltage (with switch circuitry having an input coupled to the source of the low voltage and a control input coupled to logic circuitry that contemplates what operating state the memory cell is in). In this case, if either of transistors Q1 and Q2 have an IDS current, the current will flow from BIT LINE 1007. During an ERASE phase, a positive voltage capable of drawing electrons into the well of transistor Q3 through Fowler-Nordhein tunneling is applied to ERASE node 1003. Here, transistor Q3 should have an isolated well so that it can be pulled to a high voltage. Note that transistor Q3 can be p type while transistors Q1 and Q2 can be n type. During a READ phase, transistor Q5 is turned off and transistor Q4 is turned on (e.g., with logic circuitry that contemplates the memory cell's operating state) so as to only permit current being sinked by transistor Q1 (and not Q2) to flow through BIT LINE 1007.

An alternate use of the circuit of FIG. 10, which simply reverses the logical states associated with the PROGRAM and ERASE phases from the embodiments discussed above, is to PROGRAM through transistor Q3 (i.e., during the PROGRAM phase electrons are removed from the floating thereby raising its voltage to a first logical state) and to ERASE with transistors Q1 and Q2 (i.e., during the ERASE phase electrons are added to the floating gate thereby reducing its voltage to a second logical state).

Figure 11:
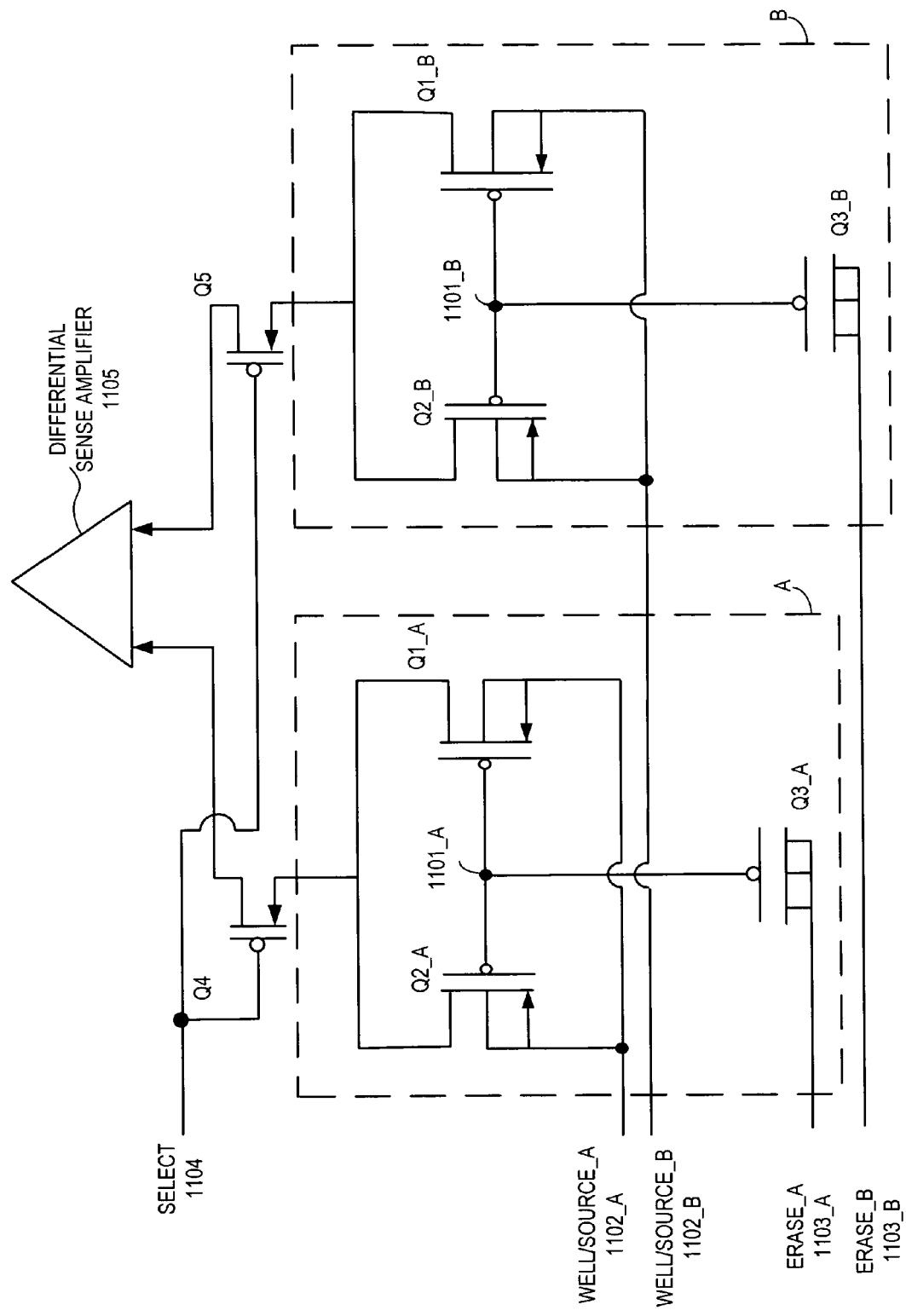
FIG. 11 depicts a differential version of the non volatile memory cell approach described herein.

FIG. 11 shows a differential non volatile memory cell utilizing the approach being described herein. A pair of "sub" non volatile memory cells "A" and "B" that utilize both impact ionization induced injection current and band-to-band tunneling induced injection current are observed. Essentially, in order to achieve differential operation, the two sub cells A, B are kept at opposite logical states (i.e., when sub-cell A is storing a logical "1" sub-cell B is storing a logical "0", and, when sub-cell B is storing a logical "0" sub-cell B is storing a logical "1"). Said another way, the two cells are set in opposing PROGRAM and ERASE phases such that when one sub-cell is in the PROGRAM phase the other sub-cell is set into the ERASE phase. The well/source nodes 1102_A, 1102_B and erase nodes 1103_A, 1103_B are therefore set to appropriate voltage levels, consistent with the teachings provided above, to effect this operation. During a read phase, one of the cells will supply current to the differential sense amplifier 1105 while the other will not. Which cell supplies the current determines the logical state "read" by the sense amplifier 1105.

Figure 12:
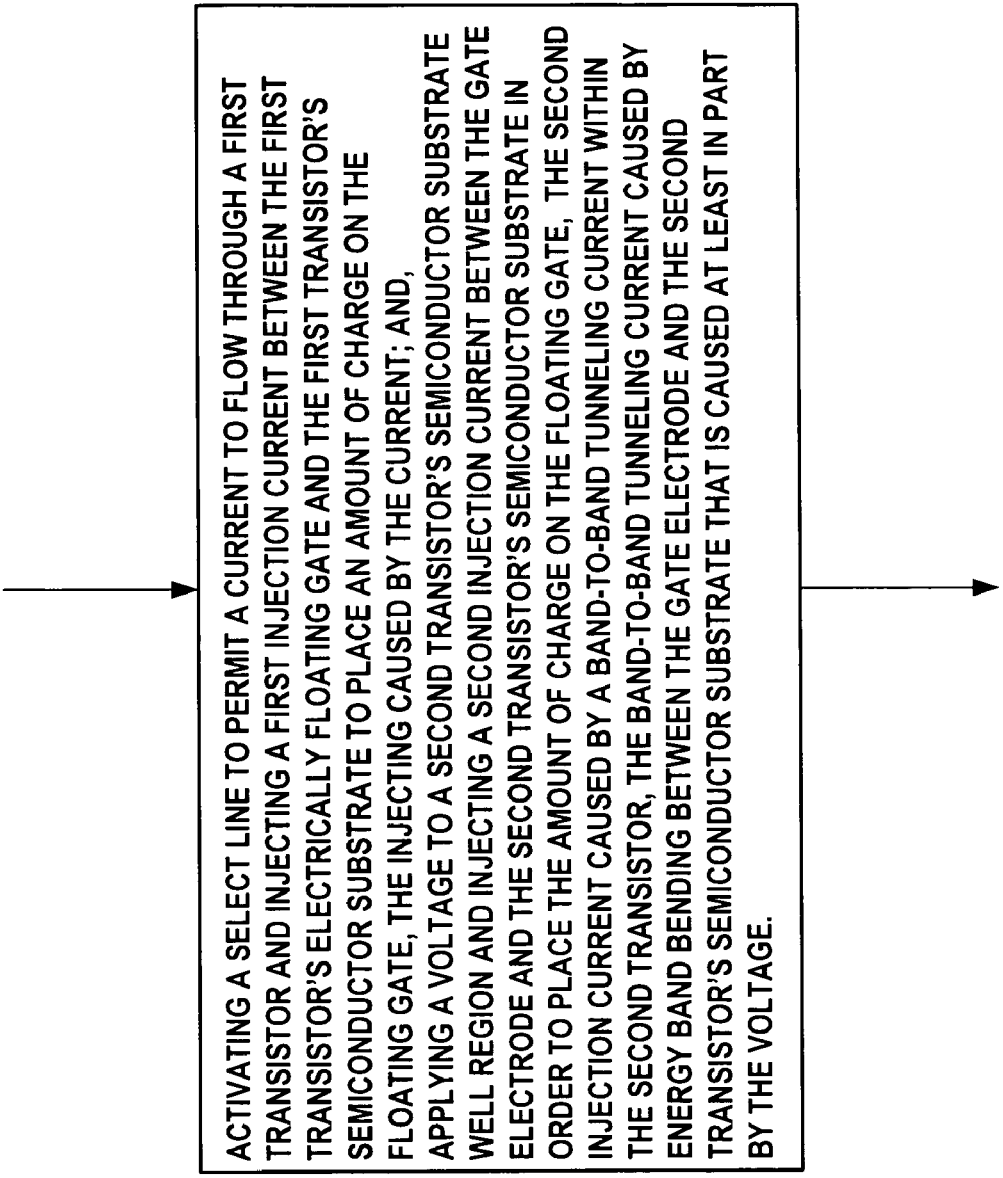
FIG. 12 depicts a method that can be executed by any of the non volatile memory cell circuits illustrated in FIGS. 8A, 8B, 8C and 10.

FIG. 12 shows a methodology that is consistent with at least one circuit described above. According to the methodology of FIG. 12, a select line is activated to permit a current to flow through a first transistor and a first injection current is injected between the first transistor's electrically floating gate and the first transistor's semiconductor substrate to place an amount of charge on the floating gate. The first injection current is caused by the current. A voltage is also applied to a second transistor's semiconductor substrate well region and a second injection current is injected between the gate electrode and the second transistor's semiconductor substrate in order to place the amount of charge on the floating gate. The second injection current is caused by a band-to-band tunneling current with the second transistor. The band-to-band tunneling current is caused by energy band bending between the gate electrode and the second transistor's semiconductor substrate. The energy band bending is caused at least in part by the voltage.

The electrical circuit(s) described in this document can be manufactured in any number of ways, as will be appreciated by the persons skilled in the art. One such way is as integrated circuit(s), as described below.

Schematic-type inputs can be provided for the purpose of preparing one or more layouts. These inputs can include as little as a schematic of a circuit, to more including relative sizes of circuit components and the like, as will be appreciated by a person skilled in the art for such inputs. These inputs can be provided in any suitable way, such as merely in writing, or electronically, as computer files and the like. Some of these computer files can be prepared with the assistance of suitable design tools. Such tools often include instrumentalities for simulating circuit behaviors and the like.

These inputs can be provided to a person skilled in the art of preparing layouts. This, whether the person is within the same company, or another company, such as under a contract.

A layout can be prepared that embodies the schematic-type inputs by the person skilled in the art. The layout is itself preferably prepared as a computer file. It may be additionally checked for errors, modified as needed, and so on.

In the above, computer files can be made from portions of computer files. For example, suitable individual designs can be assembled for the electrical components and circuits indicated in the schematic-type inputs. The individual designs can be generated anew, or selected from existing libraries. In the layout phase, the assembled designs can be arranged to interoperate, so as to implement as integrated circuit(s) the electrical circuit(s) of the provided schematic-type inputs.

These computer files can be stored in storage media, such as memories, whether portable or not, and the like.

Then a special type of computer file can be synthesized from the prepared layout, in a manner that incorporates the prepared layout, which has the embodied schematic-type inputs. Such files are known in the industry as IC chip design files or tapeout files, and express instructions for machinery as to how to process a semiconductor wafer, so as to generate an integrated circuit that is arranged as in the incorporated layout.

The synthesized tapeout file is then transferred to a semiconductor manufacturing plant, which is also known as a foundry, and so on. Transferring can be by any suitable means, such as over an electronic network. Or a tapeout file can be recorded in a storage medium, which in turn is physically shipped to the mask manufacturer.

The received tapeout file is then used by mask making machinery as instructions for processing a semiconductor wafer. The wafer, as thus processed, now has one or more integrated circuits, each made according to the layout incorporated in the tapeout file. If more than one, then the wafer can be diced to separate them, and so on.

In this description, numerous details have been set forth in order to provide a thorough understanding. In other instances, well-known features have not been described in detail in order to not obscure unnecessarily the description.

A person skilled in the art will be able to practice the present invention in view of this description, which is to be taken as a whole. The specific embodiments as disclosed and illustrated herein are not to be considered in a limiting sense. Indeed, it should be readily apparent to those skilled in the art that what is described herein may be modified in numerous ways. Such ways can include equivalents to what is described herein.

The following claims define certain combinations and subcombinations of elements, features, steps, and/or functions, which are regarded as novel and non-obvious. Additional claims for other combinations and subcombinations may be presented in this or a related document.

What is claimed is:

1. A method for operating a non-volatile memory cell, comprising:

applying a voltage across a first transistor's semiconductor drain/well diode and injecting a first injection current between a floating gate electrode and the first transistor's semiconductor well substrate in order to place a first portion of an amount of charge on the floating gate electrode, the first injection current caused by a band-to-band tunneling current within the first transistor, the band-to-band tunneling current caused by a first physical mechanism including energy band bending between the floating gate electrode and the first transistor's semiconductor drain/well diode that is caused at least in part by the applied voltage, activating a select line to permit a current to flow through a second transistor and thereby injecting a second injection current between the floating gate electrode and the second transistor's semiconductor substrate in order to place a second portion of the amount of charge on the floating gate electrode, the second injection current caused by a second physical mechanism that is different from the first physical mechanism; and, wherein the first injection current and the second injection current are both oriented to carry charge in the same direction with respect to the floating gate electrode.

2. The method of claim 1, wherein the activating the select line and the injecting the first injection current occur during different programming phases of the floating gate electrode.

3. The method of claim 2, wherein during a first of the programming phases current is not substantially injected onto the floating gate electrode from the second transistor's semiconductor substrate.

4. The method of claim 3, wherein during a second of the programming phases band-to-band tunneling does not substantially occur within the first transistor.

5. The method of claim 4, further comprising:
substantially removing the second portion of the amount of charge placed on the floating gate electrode with the second injection current with a Fowler-Nordheim tunneling current that flows between the floating gate electrode and a third transistor's semiconductor substrate region.

6. The method of claim 5, wherein the first and second transistors are p type transistors and the substantially removing the second portion of the amount of charge further comprises removing electrons placed on the floating gate electrode by the second injection current.

7. The method of claim 1, further comprising:
applying the voltage to a drain or source electrode of the second transistor while the voltage is also being the applied to the first transistor's semiconductor substrate well region, the voltage to:
create an electric field between the second transistor's drain and source electrodes; and,
create energy band bending within a gate dielectric of the first transistor.

8. The method of claim 1, further comprising:
activating a fourth transistor a conductive channel of which is disposed in series with the first transistor's source and drain electrodes while the voltage is being applied.

9. The method of claim 8 wherein, the activating a fourth transistor is performed by activating a second select line.

10. The method of claim 1, further comprising:
sensing a read current from the second transistor after both the activating and the applying.

11. The method of claim 10, further comprising:
activating the select line again after the activating and the applying but before the sensing.

12. An apparatus, comprising:
a first transistor having an electrically floating gate;
a second transistor the gate structure of which includes the electrically floating gate;
an electrode coupled to the first transistor's semiconductor substrate well region, the electrode to apply a voltage to the well region to cause energy band bending within the first transistor's semiconductor substrate beneath its gate dielectric, the energy band bending to cause a band-to-band tunneling current within the first transistor's semiconductor substrate, the band-to-band tunneling to cause a first injection current to flow through the gate dielectric onto the floating gate; and
a select line coupled to a third transistor, the third transistor coupled in series with the second transistor, the third transistor to provide current to the second transistor, the current to inject a second injection current between the second transistor's conductive semiconductor substrate region and the floating gate, the second injection current to place an amount of charge on the floating gate.

13. The apparatus of claim 12, further comprising:
a second electrode coupled to the second transistor's semiconductor substrate well region, the second electrode coupled to the first electrode, the voltage to cause the current to have a magnitude sufficient to cause the second injection current.

14. The apparatus of claim 13, wherein the first and second transistors are p type transistors.

15. The apparatus of claim 13, wherein the first and second transistors are n type transistors.

16. The apparatus of claim 12, further comprising:
a fourth transistor the gate structure of which includes the floating gate, the fourth transistor having at least one of a source, a drain and a semiconductor substrate region connected to a second electrode, the second electrode to receive a voltage when the amount of charge is to be removed from the floating gate.

17. The apparatus of claim 12, further comprising:
a fifth transistor coupled in series with the second transistor, the fifth transistor having its semiconductor substrate well region electrically connected to the third transistor's semiconductor substrate well region.

18. The apparatus of claim 17, further comprising:
a second select line coupled to the fifth transistor.

19. The apparatus of claim 18, wherein the third and fifth transistors have either their respective sources electrically connected or their respective drains electrically connected.

20. The apparatus of claim 19, further comprising:
current sense circuitry coupled to the third and fifth transistors.

21. The apparatus of claim 18, further comprising:
current sense circuitry coupled to the third transistor.

22. The apparatus of claim 12, wherein the second transistor has a different dopant profile toward the surface of the semiconductor substrate beneath the second transistor's gate dielectric than the first transistor has toward the surface of the semiconductor substrate beneath the first transistor's gate dielectric so that the second transistor has sharper energy band bending beneath its gate dielectric than the first transistor has beneath its gate dielectric when the floating gate has the amount of charge.

23. The apparatus of claim 22, wherein the different doping profile comprises more dopant material associated with the second transistor than with the first transistor.

24. The apparatus of claim 23, wherein the more dopant material includes at least one of:
a degenerately doped drain extension;
a degenerately doped source extension; and
a halo.

25. The apparatus of claim 12, wherein respective sources of the first and second transistors are connected and wherein respective drains of the first and second transistors are connected, the third transistor also being coupled in series with the second transistor.

26. The apparatus of claim 25, wherein the first and second transistors are n type transistors.

27. The apparatus of claim 25, wherein the first and second transistors are p type transistors.

28. A method comprising:
providing schematic-type inputs for the purpose of preparing a layout that embodies the inputs, in which, if the layout is incorporated in a tapeout file that is used by mask making machinery as instructions for processing a semiconductor wafer, an integrated circuit will result on the wafer according to the inputs, comprising:
a first transistor having a first gate dielectric located between an electrically floating gate electrode and a semiconductor substrate, a band-to-band tunneling current to flow between valence and conduction bands of the first transistor using a first physical mechanism to create a first injection current to flow through the first gate dielectric to establish a first amount of electrical charge on the floating gate electrode; and
a second transistor having a second gate dielectric located between the floating gate electrode and the semiconductor substrate, a second injection current to flow through the second gate dielectric using a second physical mechanism different from the first physical mechanism to establish the first amount of electrical charge on the floating gate electrode,
wherein the first injection current and the second injection current are both oriented to carry charge in the same direction with respect to the floating gate.

29. An apparatus, comprising:
a) a first non volatile memory cell:
b) a second non volatile memory cell:
c) a differential sense amplifier having a first input coupled to the first non volatile memory cell and a second input coupled to the second non volatile memory cell;
d) circuitry to program the first non volatile memory cell while the second non volatile memory cell is being erased and to erase the first non volatile memory cell while the second non volatile memory cell is being programmed;
wherein both the first and second non volatile memory cells respectively comprise:
i) first and second transistors having a same floating gate electrode the first transistor having more dopant material in its substrate region than the second transistor, the first transistor to inject a first band-to-band tunneling induced flow of electrons to the floating gate electrode, the second transistor to inject a second impact ionized induced flow of electrons to the floating gate electrode;
ii) a third transistor to remove electrons from the floating gate by means of Fowler-Nordheim tunneling.

30. The apparatus of claim 29, comprising:
a) a fourth transistor coupled between the first non volatile memory cell and the first input; and
b) a fifth transistor coupled between the second non volatile memory cell and the second input.

31. The apparatus of claim 29, wherein the first transistor has a higher concentration of acceptor atoms between its source and drain regions than does the second transistor.

32. The apparatus of claim 31, wherein said second transistor has a halo but said first transistor does not.

33. The apparatus of claim 31, wherein the first transistor has a source extension and/or a drain extension but the second transistor does not.

34. The apparatus of claim 31, wherein the first transistor has a lightly doped drain but the second transistor does not.

35. A method comprising:
providing schematic-type inputs for the purpose of preparing a layout that embodies the inputs, in which, if the layout is incorporated in a tapeout file that is used by mask making machinery as instructions for processing a semiconductor wafer, an integrated circuit will result on the wafer according to the inputs, comprising:
a first transistor having an electrically floating gate;
a second transistor the gate structure of which includes the electrically floating gate;
an electrode coupled to the first transistor's semiconductor substrate well region, the electrode to apply a voltage to the well region to cause energy band bending within the first transistor's semiconductor substrate beneath its gate dielectric, the energy band bending to cause a band-to-band tunneling current within the first transistor's semiconductor substrate, the band-to-band tunneling to cause a first injection current to flow through the gate dielectric onto the floating gate; and a select line coupled to a third transistor, the third transistor coupled in series with the second transistor, the third transistor to provide current to the second transistor, the current to inject a second injection current between the second transistor's conductive semiconductor substrate region and the floating gate, the second injection current to place an amount of charge on the floating gate.

36. An article comprising a machine-readable memory containing thereon instructions which, if executed by mask making machinery as instructions for processing a semiconductor wafer, an integrated circuit will result on the wafer, comprising:

a first transistor having an electrically floating gate;

a second transistor the gate structure of which includes the electrically floating gate;

an electrode coupled to the first transistor's semiconductor substrate well region, the electrode to apply a voltage to the well region to cause energy band bending within the first transistor's semiconductor substrate beneath its gate dielectric, the energy band bending to cause a band-to-band tunneling current within the first transistor's semiconductor substrate, the band-to-band tunneling to cause a first injection current to flow through the gate dielectric onto the floating gate; and a select line coupled to a third transistor, the third transistor coupled in series with the second transistor, the third transistor to provide current to the second transistor, the current to inject a second injection current between the second transistor's conductive semiconductor substrate region and the floating gate, the second injection current to place an amount of charge on the floating gate.

* * * * *